(12) United States Patent
Tanzawa

(10) Patent No.: US 10,262,739 B2
(45) Date of Patent: *Apr. 16, 2019

(54) DEVICES INCLUDING MEMORY ARRAYS, ROW DECODER CIRCUITRIES AND COLUMN DECODER CIRCUITRIES

(71) Applicant: Micron Technology, Inc., Boise, ID (US)

(72) Inventor: Toru Tanzawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/995,626

(22) Filed: Jun. 1, 2018

(65) Prior Publication Data

US 2018/0286484 A1   Oct. 4, 2018

Related U.S. Application Data

(60) Continuation of application No. 15/615,652, filed on Jun. 6, 2017, now Pat. No. 10,014,057, which is a division of application No. 14/657,252, filed on Mar. 13, 2015, now Pat. No. 9,711,224.

(51) Int. Cl.
| | |
|---|---|
| *G11C 16/08* | (2006.01) |
| *G11C 16/04* | (2006.01) |
| *G11C 8/10* | (2006.01) |
| *G11C 5/02* | (2006.01) |

(52) U.S. Cl.
CPC .............. *G11C 16/08* (2013.01); *G11C 5/02* (2013.01); *G11C 5/025* (2013.01); *G11C 8/10* (2013.01); *G11C 16/0483* (2013.01)

(58) Field of Classification Search
CPC ........... G11C 16/08; G11C 5/02; G11C 5/025; G11C 8/10; G11C 16/0483
See application file for complete search history.

(56) References Cited

U.S. PATENT DOCUMENTS

| | | | |
|---|---|---|---|
| 7,898,850 B2 | 3/2011 | Min et al. | |
| 7,978,492 B2 | 7/2011 | Johnson et al. | |
| 8,508,967 B2 * | 8/2013 | Yamazaki | G11C 5/025 365/149 |

(Continued)

OTHER PUBLICATIONS

Choi et al., "3D Approaches for Non-Volatile Memory", IEEE Symposium on VLSI Technology Digest of Technical Papers, 2011, United States, pp. 178-179.

(Continued)

*Primary Examiner* — Tri M Hoang
(74) *Attorney, Agent, or Firm* — Wells St. John P.S.

(57) ABSTRACT

Some embodiments include a device having an array of memory cells, a memory control unit at least partially under the array, row decoder circuitry in data communication with the memory control unit, and column decoder circuitry in data communication with the memory control unit. Some embodiments include a device having an array of memory cells, row decoder circuitry and column decoder circuitry. One of the row and column decoder circuitries is within a unit that extends at least partially under the array of memory cells and the other within a unit that is laterally outward of the array of memory cells.

20 Claims, 12 Drawing Sheets

(56) References Cited

U.S. PATENT DOCUMENTS

| | | | |
|---|---|---|---|
| 8,654,584 B2* | 2/2014 | Kim | G11C 16/0466 365/185.17 |
| 8,778,762 B2 | 7/2014 | Keshav et al. | |
| 8,785,314 B2* | 7/2014 | Pellizzer | H01L 45/06 438/104 |
| 8,873,271 B2 | 10/2014 | Lam et al. | |
| 9,042,161 B2* | 5/2015 | Koyama | G11C 5/025 365/149 |
| 9,190,144 B2* | 11/2015 | Castro | G11C 13/0004 |
| 2010/0157647 A1 | 6/2010 | Rinerson et al. | |
| 2010/0214812 A1 | 8/2010 | Kim | |
| 2012/0063194 A1 | 3/2012 | Baek et al. | |
| 2014/0104938 A1 | 4/2014 | Castro et al. | |
| 2014/0131764 A1 | 5/2014 | Davis et al. | |
| 2014/0177311 A1 | 6/2014 | Chen | |
| 2014/0191306 A1 | 7/2014 | Hopkins | |

OTHER PUBLICATIONS

Crowley et al., "512Mb PROM with 8 Layers of Antifuse/Diode Cells", IEEE International Solid-State Circuits Conference (ISSCC) Session 16, Non-Volatile Memory Paper 16.4, 2003, United States, 10 pages.

Jang et al., "Vertical Cell Array using TCAT (Terabit Cell Array Transistor) Technology for Ultra High Density NAND Flash Memory", IEEE Symposium on VLSI Technology Digest of Technical Papers, 2009, United States, pp. 192-193.

Johnson et al., "512-Mb PROM With a Three-Dimensional Array of Diode/Antifuse Memory Cells", IEEE Journal of Solid-State Circuits vol. 38, No. 11, Nov. 2003, United States, pp. 1920-1928.

Katsumata et al., "Pipe-Shaped BiCS Flash Memory with 16 Stacked Layers and Multi-Level-Cell Operation for Ultra High Density Storage Devices", IEEE Symposium on VLSI Technology Digest of Technical Papers, 2009, United States, pp. 136-137.

Kim et al., "Multi-Layered Vertical Gate NAND Flash Overcoming Stacking Limit for Terabit Density Storage", IEEE Symposium on VLSI Technology Digest of Technical Papers, 2009, United States, pp. 188-189.

Komori et al., "Disturbless Flash Memory due to High Boost Efficiency on BiCS Structure and Optimal Memory Film Stack for Ultra High Density Storage Device", IEEE International Electron Devices Meeting (IEDM), Dec. 2008, United States, 4 pages.

Park et al., "Three-Dimensional 128Gb MLC Vertical NAND Flash-Memory with 24-WL Stacked Layers and 50MB/s High-Speed Programming", IEEE International Solid-State Circuits Conference (ISSCC) Session 19, Nonvolatile Memory Solutions Paper 19.5, 2014, United States, 3 pages.

Kim et al., "Novel Vertical-Stacked-Array-Transistor (VSAT) for Ultra-High-Density and Cost-Effective NAND Flash Memory Devices and SSD (Solid State Drive)", IEEE Symposium on VLSI Technology Digest of Technical Papers, 2009, United States, pp. 186-187.

* cited by examiner

DEVICES INCLUDING MEMORY ARRAYS, ROW DECODER CIRCUITRIES AND COLUMN DECODER CIRCUITRIES

RELATED PATENT DATA

This patent resulted from a continuation of U.S. patent application Ser. No. 15/615,652 which was filed Jun. 26, 2017, now U.S. Pat. No. 10,014,057, which is a divisional of U.S. patent application Ser. No. 14/657,252, which was filed Mar. 13, 2015, now U.S. Pat. No. 9,711,224, each of which is incorporate by reference herein.

TECHNICAL FIELD

Devices including memory arrays, row decoder circuitries and column decoder circuitries.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells. Example NAND architecture is described in U.S. Pat. Nos. 7,898,850 and 8,778,762, and in U.S. Patent Publication Nos. 2014/0191306 and 2014/0131784.

FIG. 1 shows a block diagram of a prior art device 100 which includes a memory array 102 having a plurality of memory cells 103 arranged in rows and columns along with access lines 104 (e.g., wordlines to conduct signals WL0 through WLm) and first data lines 106 (e.g., bitlines to conduct signals BL0 through BLn). Access lines 104 and first data lines 106 may be used to transfer information to and from the memory cells 103. Row decoder circuitry 107 and column decoder circuitry 108 decode address signals A0 through AX on address lines 109 to determine which ones of the memory cells 103 are to be accessed. Driver circuitry 91 may be utilized in conjunction with the row decoder circuitry to drive a selected wordline 104, and similarly driver circuitry 93 may be utilized in conjunction with the column decoder circuitry to drive a selected data line 106. A sense amplifier circuit 115 operates to determine the values of information read from the memory cells 103. An I/O circuit 117 transfers values of information between the memory array 102 and input/output (I/O) lines 105. Signals DQ0 through DQN on the I/O lines 105 can represent values of information read from or to be written into the memory cells 103. Other devices can communicate with the device 100 through the I/O lines 105, the address lines 109, or the control lines 120. A memory control unit 118 controls memory operations to be performed on the memory cells 103 utilizing signals on the control lines 120. The device 100 can receive supply voltage signals Vcc and Vss on a first supply line 130 and a second supply line 132, respectively. The first and second supply lines 130 and 132 may be coupled with a power management circuit 95. Also, other components of device 100 may be coupled with the power management circuit, although such electrical couplings are not specifically shown in FIG. 1.

The device 100 includes a select circuit 140 which may be utilized with the input/output (I/O) circuit 117. The select circuit 140 can respond, via the I/O circuit 117, to signals CSEL1 through CSELn to select signals on the first data lines 106 and the second data lines 113 that can represent the values of information to be read from or to be programmed into the memory cells 103. The column decoder circuitry 108 can selectively activate the CSEL1 through CSELn signals based on the A0 through AX address signals on the address lines 109. The select circuit 140 can select the signals on the first data lines 106 and the second data lines 113 to provide communication between the memory array 102 and the I/O circuit 117 during read and programming operations.

FIG. 2 shows a block diagram of a prior art memory array (e.g., the memory array 102 of FIG. 1) in the form of a 3D NAND memory device 200. The device 200 may comprise a plurality of strings of charge storage devices. In a first (e.g., Z-Z') direction, each string of charge storage devices may comprise, for example, thirty two charge storage devices stacked over one another with each charge storage device corresponding to one of, for example, thirty two tiers (e.g., Tier0-Tier31). The charge storage devices of a respective string may share a common channel region, such as one formed in a respective pillar of semiconductor material (e.g., polysilicon) about which the string of charge storage devices are formed. In a second (e.g., X-X') direction, each first group of, for example, sixteen first groups of the plurality of strings may comprise, for example, eight strings sharing a plurality (e.g., thirty two) of access lines (WLs). Each of the plurality of access lines (hereinafter used interchangeably with "global control gate (CG) lines") may couple (e.g., electrically or otherwise operably connect) the charge storage devices corresponding to a respective tier of the plurality of tiers of each string of a corresponding one of the first groups. The charge storage devices coupled by the same access line (and thus corresponding to the same tier) may be logically grouped into, for example, two pages, such as P0/P32, P1/P33, P2/P34 and so on, when each charge storage device comprises a multi-level cell capable of storing two bits of information. In a third (e.g., Y-Y') direction, each second group of, for example, eight second groups of the plurality of strings may comprise sixteen strings coupled by a corresponding one of eight data lines (BLs). The CGs of the (e.g., sixteen) charge storage devices corresponding to a respective tier of the (e.g., sixteen) strings of each second group of strings may be physically coupled by a respective plate. Similarly, SGSs of the (e.g., sixteen) strings of each second group of strings may be physically coupled by a single plate. The size of a memory block may comprise 1,024 pages and total about 16 MB (e.g., 16 WLs×32 Tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_J$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332-336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge storage devices corresponding to the respective partial block and/or tier independently of those of other partial blocks and/or other tiers. The charge storage devices corresponding to the respective subset (e.g., partial block) and the respective tier may comprise a "partial tier" (e.g., a single "tile") of charge storage devices. The strings corresponding to the respective subset (e.g., partial block) may be coupled to a corresponding one of sub-sources 372, 374 and 376 (e.g., "tile source") with each sub-source being coupled to a respective power source.

FIG. 4 shows a region of a prior art semiconductor wafer. Such region is subdivided amongst a plurality of individual die 400. The die may all be substantially identical to one another, and ultimately the die may be singulated into individual units suitable for incorporation into individual packages. For instance, each die may correspond to a memory chip.

FIG. 5 shows an example singulated die 400 from the region identified as region 5 of FIG. 4. The illustrated die 400 comprises a memory array region 102 (also identified as the Array (A)), row decoder circuitry 107 (also identified as Row (R)), column decoder circuitry 108 (also identified as Col (C)), a peripheral region 412 (also identified as Peri (P)), and a bonding pad region 414 (also identified as Bonding Pad (B)). Additionally, a memory control unit (MCU) 118 is shown to be within the peripheral region 412.

The die of FIG. 5 may be considered to be an example of a two-dimensional arrangement, in that no components are stacked under the array 102. In contrast, FIG. 6 shows a prior art die 400a illustrating an example three-dimensional arrangement. The array 102 is divided amongst a plurality of tiles (T) 420, and each tile has column decoder circuitry (C) 108 and row decoder circuitry (R) 107 under the array 102, (the regions 107 and 108 are shown in phantom view relative to one of the tiles to indicate that they are under the array region). Also, drivers (D) 91/93 are within each tile and under the array region.

The configuration of FIG. 6 advantageously saves die area by stacking the row and column decoder circuitries under the array. The tiles may be utilized in an effort to reduce wordline resistance and/or bitline resistance across an array while maintaining desired access speeds. However, the tile configuration introduces additional complications and associated expenses into die fabrication and array programming. It is desired to develop new arrangements of various components of memory chips which save die area, and which enable desired access speeds to be achieved.

DETAILED DESCRIPTION OF THE ILLUSTRATED EMBODIMENTS

Some embodiments include recognition that it may be advantageous to place one or more components normally associated with peripheral circuitry under an array of memory cells in order to increase packing density within a semiconductor die. For instance, it may be advantageous to place the memory control unit, the power management circuit, the I/O circuit, and/or the sense amplifiers under the memory array. In conventional die fabrication, it is often not feasible to place peripheral circuit components under the memory array due to the subdivision of the array within tile architecture. However, some embodiments recognize that it may be possible to eliminate the tile architecture by changing bitline/wordline materials to lower resistance materials, reducing the size of the memory array, etc.

Some embodiments include recognition that it may be advantageous to have one of the row/column decoder circuitries under a memory array and the other of the row/column decoder circuitries laterally adjacent to the memory array. Such embodiments may be effective in non-tiled architectures, and may even have application to some tiled architectures.

Example embodiments are described with reference to FIGS. 7-12.

Figure 4:
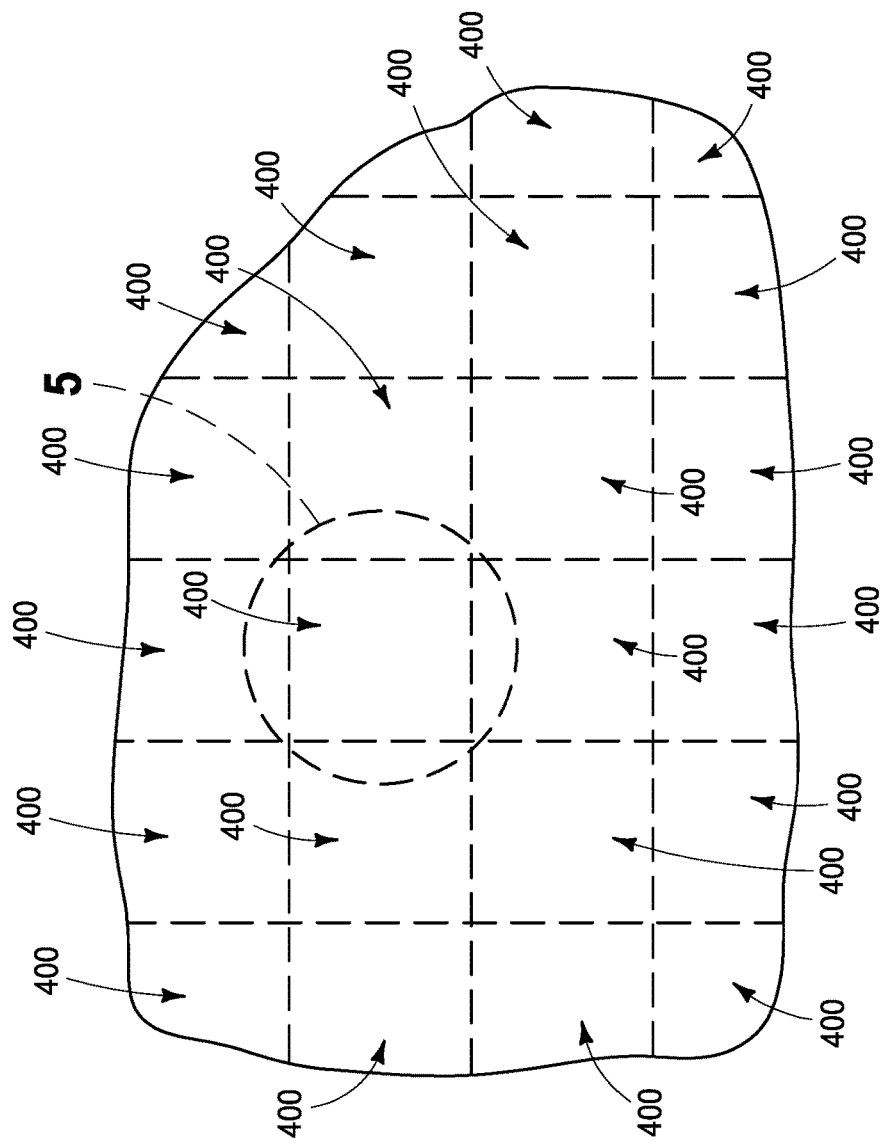
FIG. 4 is a diagrammatic view of a region of a prior art semiconductor wafer.
Figure 7:
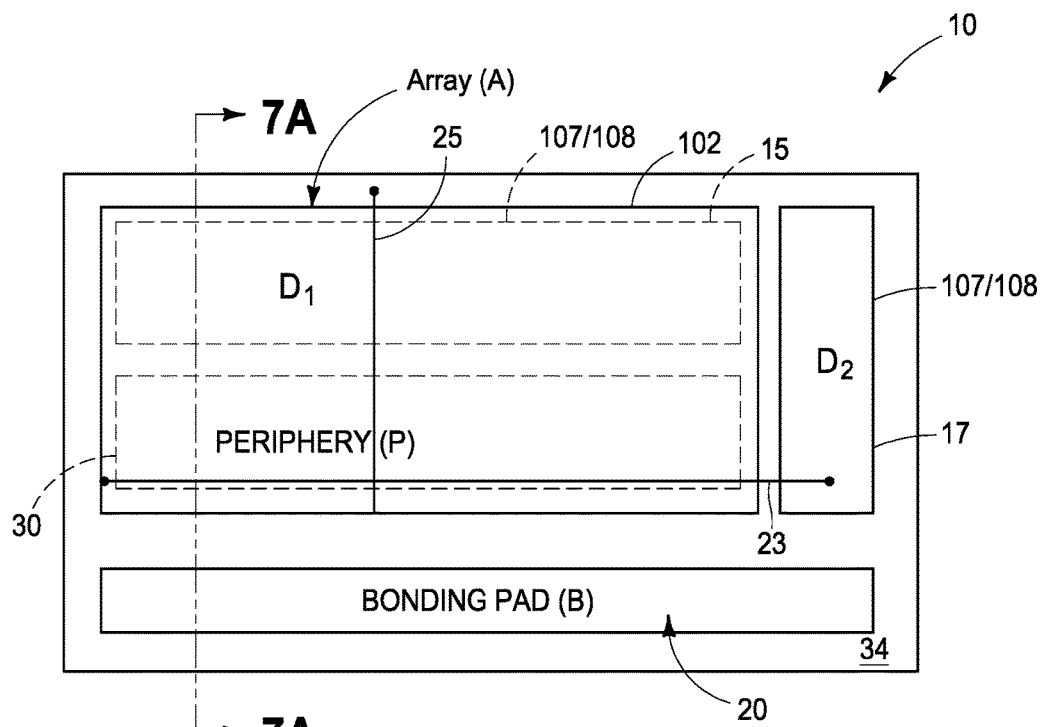
FIGS. 7-12 are diagrammatic views of example dies illustrating example arrangements of various components in accordance with example embodiments.
Figure 7A:
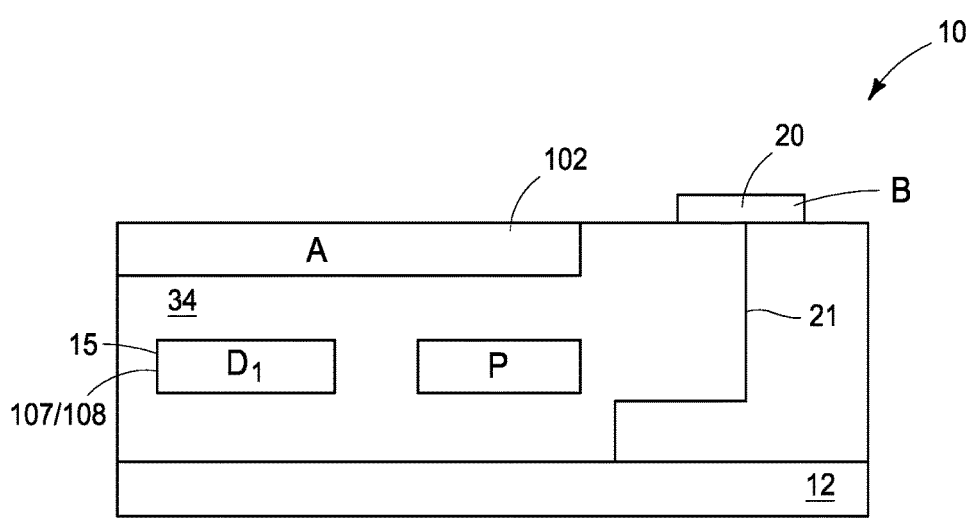
FIGS. 7A and 8A are diagrammatic cross-sectional views along the lines 7A-7A and 8A-8A of FIGS. 7 and 8, respectively.

FIGS. 7 and 7A show a die 10 in accordance with an example embodiment. The illustrated die is a singulated die. However, it is to be understood that the die 10 may be also be one of a plurality of dice associated with a wafer analogous to the dice 400 described above with reference to FIG. 4.

The die 10 comprises an array (A) 102. The array is an array of memory cells, and in some embodiments may be an array of NAND memory cells. In other embodiments, the array may comprise any other suitable memory cells.

A pair of decoder circuitries $D_1$ and $D_2$ are provided proximate the array. One of the decoder circuitries corresponds to row decoder circuitry 107 and the other corresponds to column decoder circuitry 108. The decoder circuitries are generically labeled 107/108 in FIG. 7. The decoder circuitry $D_1$ is within a single unit 15 under the array 102, and the decoder circuitry $D_2$ is within a single unit 17 laterally adjacent to the array. The units 15 and 17 may be referred to as first and second units, respectively.

Although the unit 15 of decoder circuitry $D_1$ is shown to be entirely under the array, in other embodiments the unit of decoder circuitry may be configured to have only a portion directly under the array and to have another portion which is not directly under the array (for instance, in embodiments analogous to those described below with reference to FIGS. 9 and 12).

A bonding pad 20 is adjacent to the array. The bonding pad 20 may be analogous to the bonding pad 414 described above with reference to FIG. 5.

Figure 1:
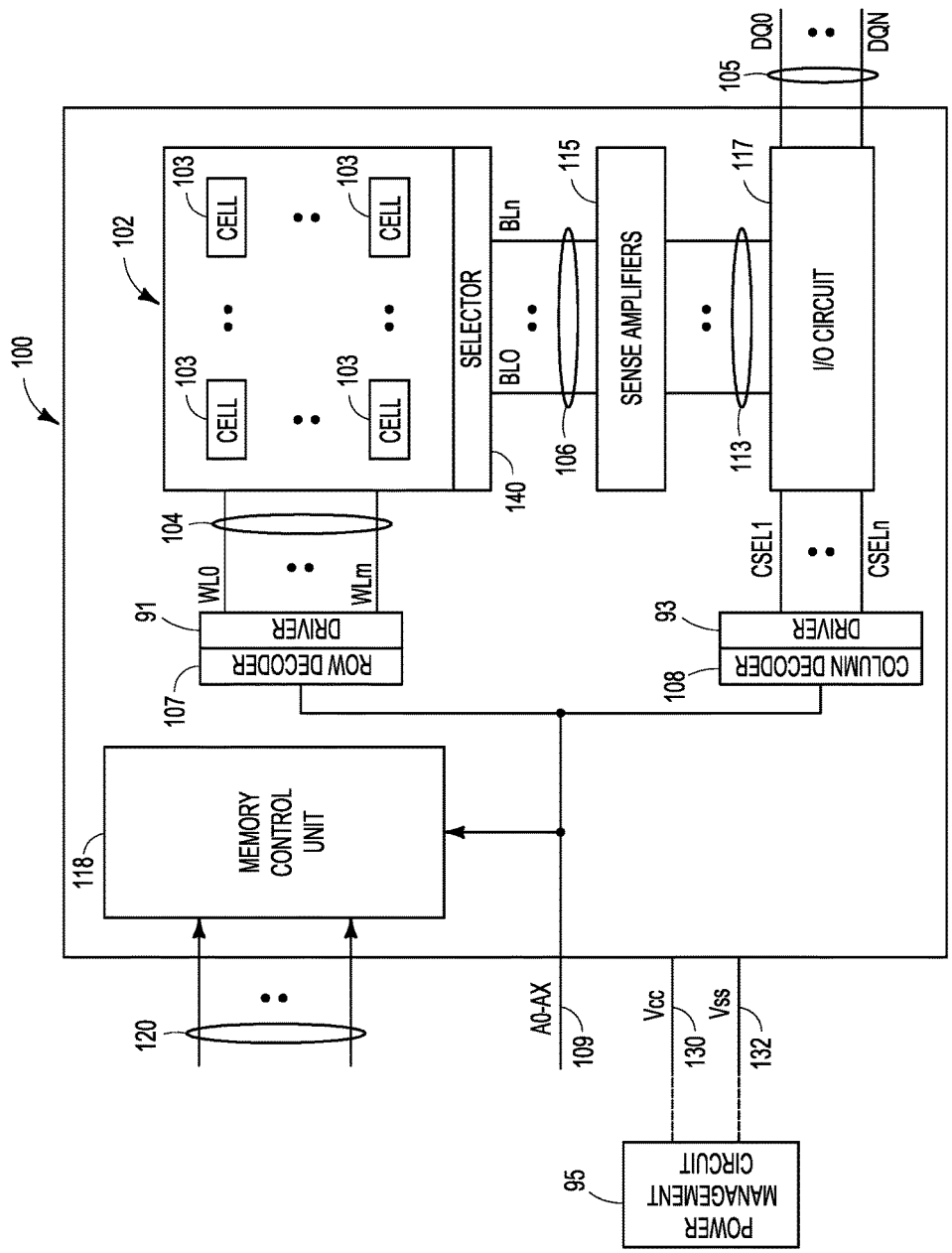
FIG. 1 shows a block diagram of a prior art memory device having a memory array with memory cells.
Figure 2:
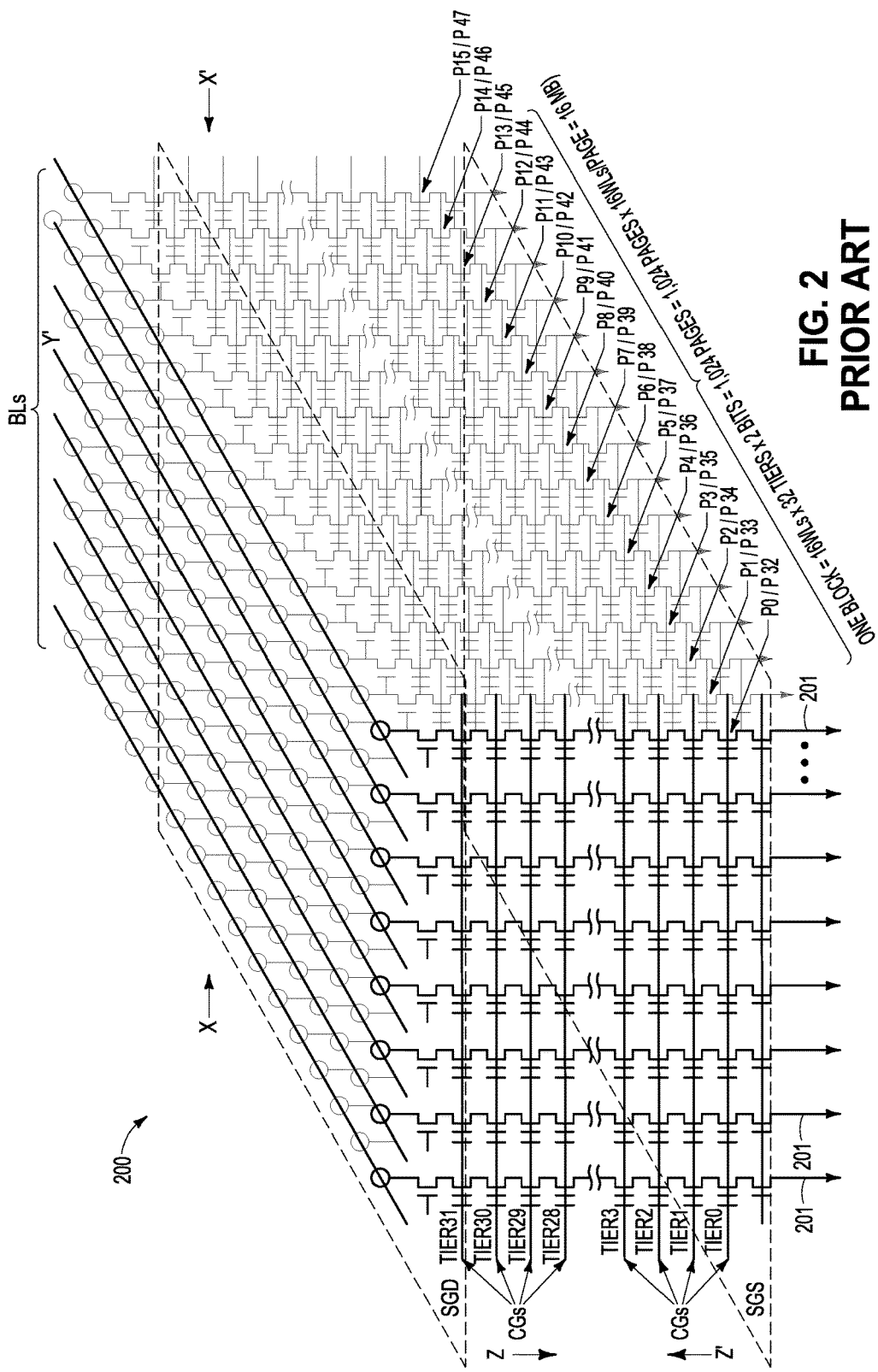
FIG. 2 shows a schematic diagram of the prior art memory array of FIG. 1 in the form of a 3D NAND memory device.
Figure 3:
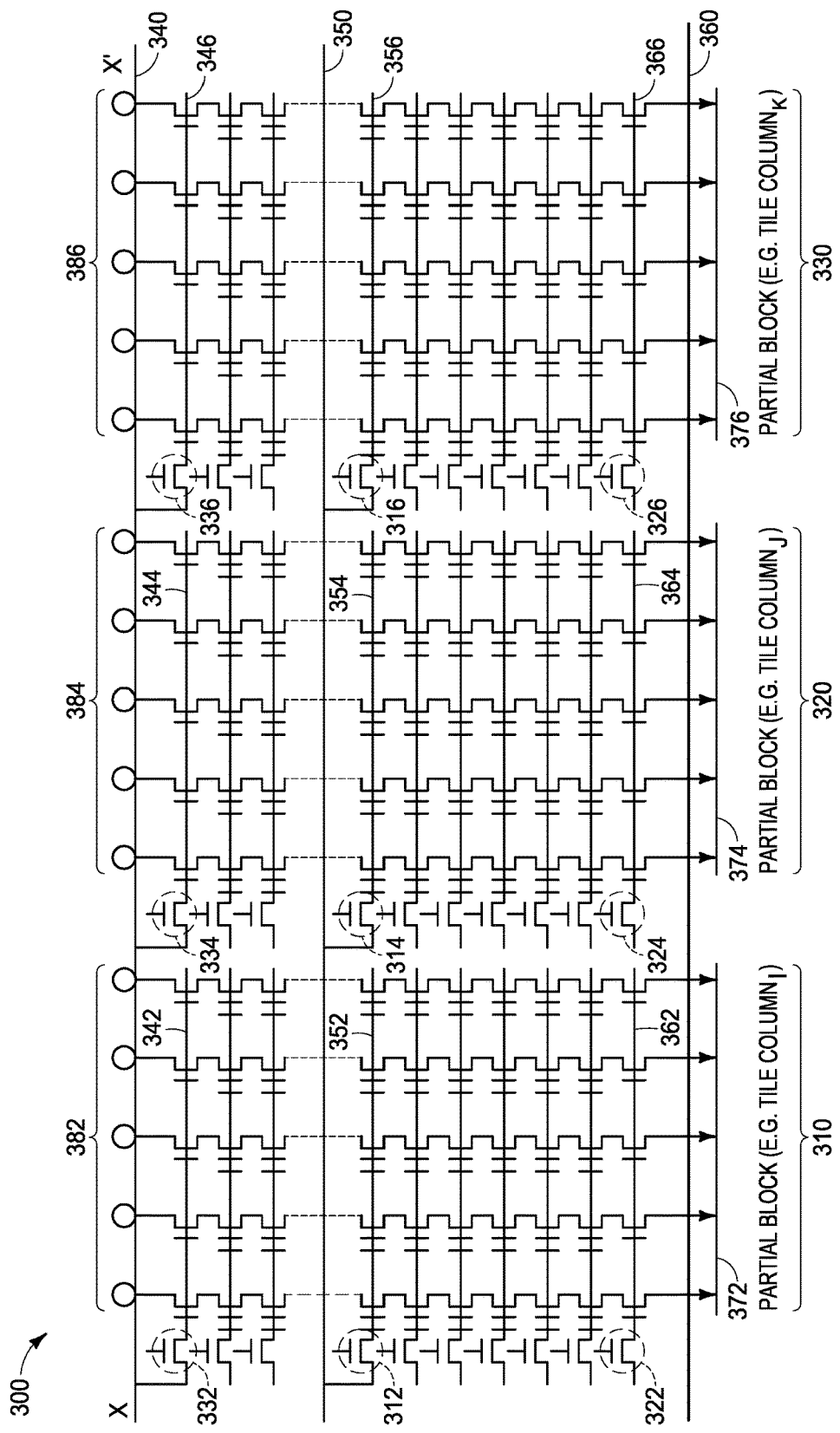
FIG. 3 shows a cross sectional view of the prior art 3D NAND memory device of FIG. 2 in an X-X' direction.

Peripheral circuitry 30 is under the array and laterally adjacent to the decoder circuitry $D_1$. The peripheral circuitry includes circuitry other than the array of memory cells, and the row and column decoder circuitries. The peripheral circuitry under the array may comprise any of numerous components, including, for example, the memory control unit (118 of FIG. 1), the power management unit (95 of FIG. 1), the I/O circuit (117 of FIG. 1), etc. Additional peripheral circuitry (not shown) may be laterally adjacent to the array. In some embodiments, a unit comprised by the peripheral circuitry may be entirely under the array, and in other embodiments may be only partially under the array. For instance, in some embodiments a memory control unit may be entirely under the array, and in other embodiments only a portion of the memory control unit may be under the array.

In some embodiments, $D_1$ is row decoder circuitry, and row driver circuitry (91 of FIG. 1) is under the array 102 together with the decoder circuitry $D_1$.

In some embodiments, $D_1$ is column decoder circuitry, and one or more of column driver circuitry (93 of FIG. 1), I/O circuitry (117 of FIG. 1) and sense amplifier circuitry (115 of FIG. 1) is under the array 102 together with the decoder circuitry $D_1$.

FIG. 7A is a cross-sectional view of die 10, and shows a base 12 supporting the various components. The base 12 may comprise semiconductor material, and in some embodiments may comprise, consist essentially of, or consist of monocrystalline silicon. In some embodiments, base 12 may be considered to comprise a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, base 12 may correspond to a semiconductor substrate containing one or more materials associated with integrated circuit fabrication. Some of the materials may be under the shown region of base 12 and/or may be laterally adjacent to the shown region of base 12; and may correspond to, for example, one or more of refractory metal materials, barrier materials, diffusion materials, insulator materials, etc.

The decoder circuitry $D_1$ and the peripheral circuitry 30 are shown to be directly under the array 102, and are contained within insulative material 34. The insulative material 34 may comprise any suitable material, including, for example, one or more of silicon dioxide, silicon nitride, borophosphosilicate glass, etc. Although the decoder circuitry $D_1$ and the peripheral circuitry 30 are both shown to be spaced from base 12 by insulative material 34, in other embodiments one or both of the decoder circuitry $D_1$ and the peripheral circuitry 30 may be along an upper surface of base 12. Also, although the decoder circuitry $D_1$ and the peripheral circuitry 30 are both shown to be at a same elevational level as one another above base 12, in other embodiments they may be at different elevational levels relative to one another.

The decoder circuitry $D_1$ and the peripheral circuitry 30 may comprise any suitable circuit components, and in some embodiments one or both of the decoder circuitry $D_1$ and the peripheral circuitry 30 may comprise one or more transistor gates.

The bond pad 20 is shown to be supported over insulative material 34, and to be electrically coupled to base 12 through an interconnecting wire 21. The illustrated connection to base 12 is an example connection, and the bond pad may have any suitable connections to any circuitries associated with die 10. For instance, in some embodiments the bond pad may have electrical connections to one or more of the circuitries corresponding to the array, the periphery, and the decoders $D_1$ and $D_2$; either in addition to, or alternatively to, the illustrated electrical connection to base 12.

Referring to FIG. 7, conductive line 23 extends from decoder circuitry $D_2$ across the array 102, and conductive line 25 extends from decoder circuitry $D_1$ across the array. The conductive lines 23 and 25 are examples of wordlines and bitlines that may extend across the array. The wordlines extend from the row decoder, and the bitlines extend from the column decoder. Notably, the conductive line 25 extends past the array to electrically connect with the decoder circuitry $D_1$. This is due to the decoder circuitry $D_1$ being under the array. In other embodiments, other methods of connecting conductive line 25 to the decoder circuitry $D_1$ may be utilized.

Figure 5:
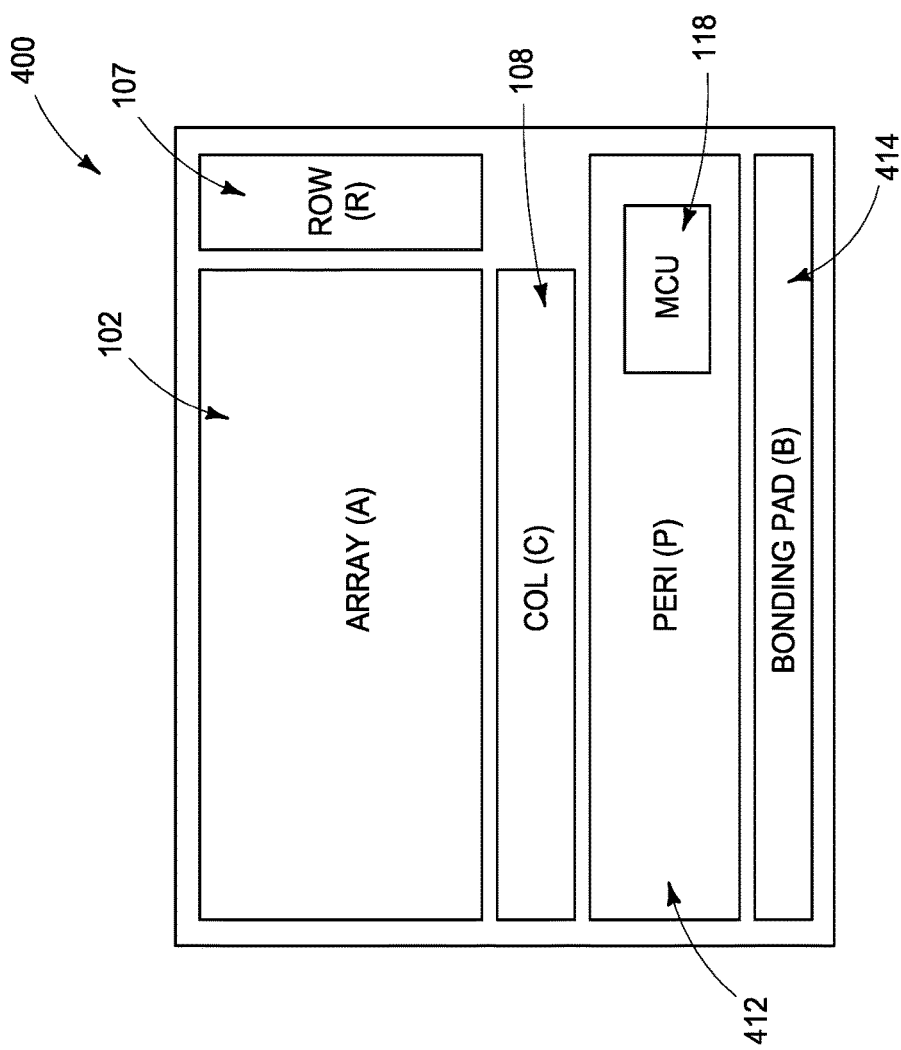
FIGS. 5 and 6 are diagrammatic views of example prior art semiconductor dies.

The footprint comprised by the illustrated components of die 10 of FIG. 7 may be smaller than the footprint comprised by similar components of the prior art die 400 of FIG. 5. Notably, the footprint of die 10 comprises the area of the array 102, together with the areas of the decoder $D_2$ and the bonding pad 20. In contrast, the footprint of die 400 comprises the area of the array together with areas of the bonding pad, both of the row and column decoders, and the periphery 118. Accordingly, the configuration of the die 10 of FIG. 7 may advantageously enable a larger number of dice to be formed from a single wafer than can be accomplished utilizing the prior art die 400 of FIG. 5. Further, the die 10 of FIG. 7 does not have a tiled architecture, which can simplify processing and reduce expense of fabrication of the die 10 of FIG. 7 relative to the prior art die of FIG. 6.

Figure 8:
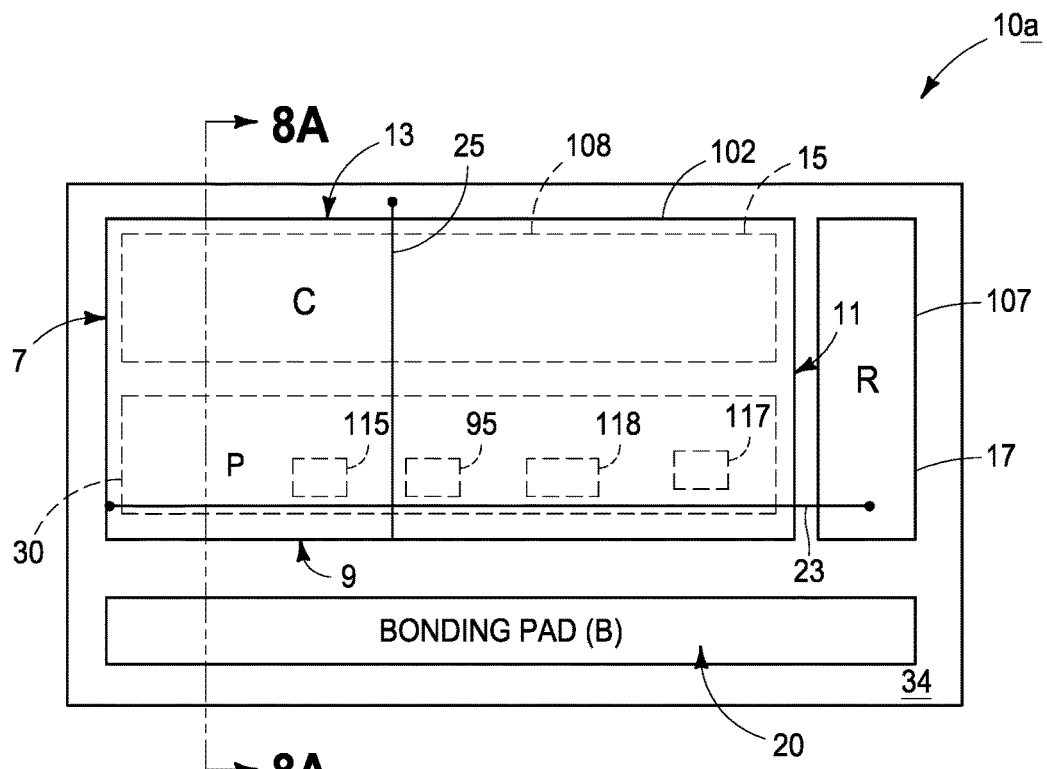
Figure 8A:
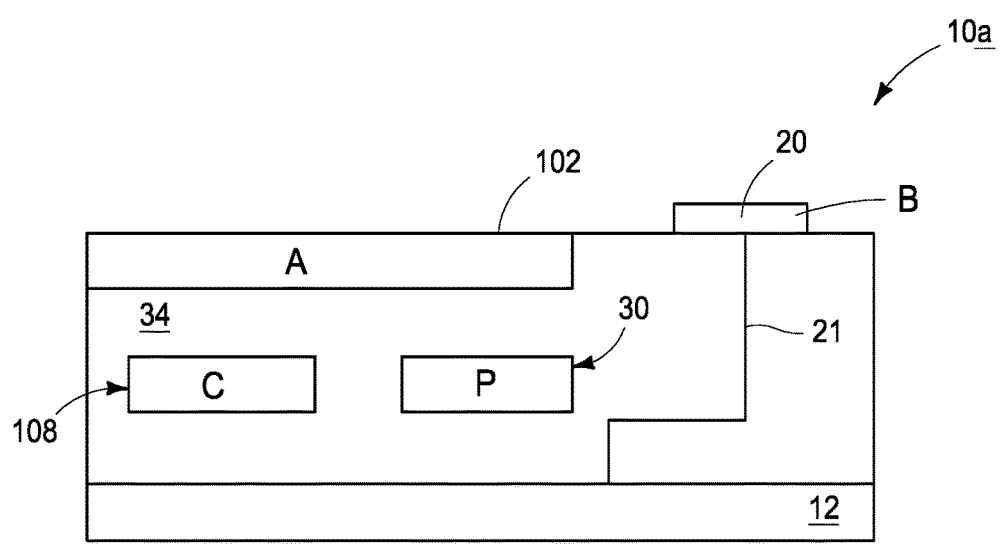

FIGS. 8 and 8A show a die 10a illustrating an embodiment similar to that of FIG. 7, but in which the first unit 15 specifically corresponds to column decoder circuitry (C) 108, and in which the second unit 17 specifically corresponds to row decoder circuitry (R) 107. In the embodiment of FIG. 8, the conductive line 23 is a wordline, and the conductive line 25 is a bitline. A memory control unit 118, a power management circuit 95, an I/O circuit 117 and a sense amplifier circuit 115 are specifically illustrated to be part of the peripheral circuitry 30 that is under the array 102. In other embodiments, the peripheral circuitry 30 may comprise other components in addition to the shown components 118, 95, 117 and 115; or may comprise less than all of the shown components 118, 95, 117 and 115.

The array 102 is shown to have a rectangular configuration with four primary sides 7, 9, 11 and 13. In the illustrated embodiment, the bonding pad 20 is along a first of the primary sides (specifically side 9) and the unit 17 of row decoder circuitry 107 is along another of the primary sides (specifically side 11) which is adjacent to the first primary side.

The footprint of die 10a of FIG. 8 comprises the area of the array 102, together with the areas of the row decoder circuitry 107 and the bonding pad 20. In contrast, the footprint of the prior art die 400 of FIG. 5 comprises the area of the array together with areas of the bonding pad, both of the row and column decoders, and the periphery 118. Accordingly, the configuration of the die 10a of FIG. 8 may advantageously enable a larger number of dice to be formed from a single wafer than can be accomplished utilizing the prior art die 400 of FIG. 5. Further, the die 10a of FIG. 8 does not have a tiled architecture, which can simplify processing and reduce expense of fabrication of the die 10a of FIG. 8 relative to the prior art die of FIG. 6.

The embodiment of FIG. 8 shows the column decoder unit 15 under the array 102 to be adjacent one of the edges of the array. Such requires fabrication of bitlines 25 which extend a full dimension of the array. Depending on the size of the array and the resistance of the material utilized for the bitlines, there may be difficulties in configuring the bitlines while also maintaining low enough resistance to enable desired performance characteristics. FIG. 9 shows a die 10b illustrating an alternative arrangement in which the column decoder 15 under the array is provided as a single unit centrally located relative to the array. The array is subdivided into two units A1 and A2. In the shown embodiment, both units are approximately the same size as one another, which may be preferred in some applications in that it provides similar access times across the entirety of the array. However, in other embodiments one of the units $A_1$ and $A_2$ may be of a different size relative to the other. The units $A_1$ and $A_2$ may be considered to be portions of a single array in some embodiments, and in other embodiments may be considered to correspond to two different arrays of memory cells.

The column decoder circuitry 108 is configured as a single unit 15 having outer edges 31 that are directly under the array 102 of memory cells (with the outer edges being shown in phantom view to indicate that they are beneath array 102), and having a central region 33 which is not directly under the array.

The centralized location of column decoder circuitry 108 under the array 102 enables the long bitline 25 (FIG. 8) to be replaced with shorter bitlines 25a and 25b. This may enable desired performance characteristics to be achieved with higher resistance bitline materials as compared to the bitline materials suitable for utilization in the embodiment of FIG. 8.

Figure 9:
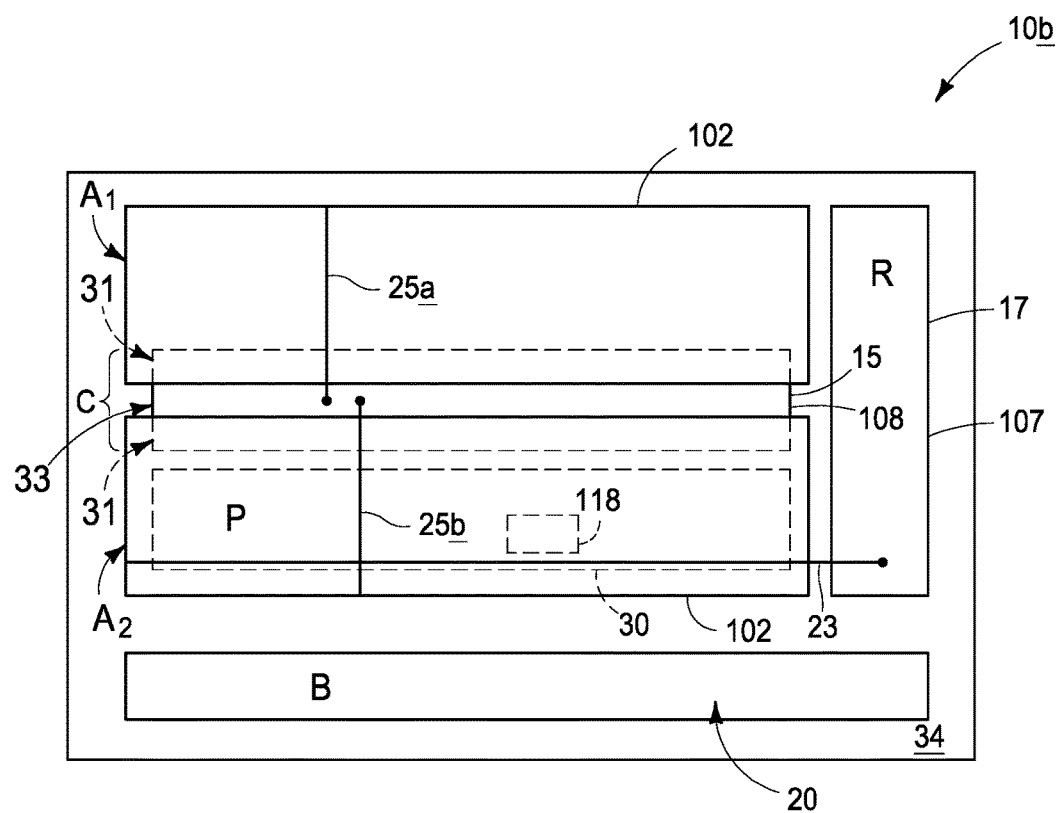

A memory control unit 118 is specifically illustrated to be part of the peripheral circuitry 30 that is under the array 102 of FIG. 9. In other embodiments, the peripheral circuitry 30 may comprise other components in addition to, or alternatively to, the shown component 118.

A cross-sectional side view of FIG. 9 is not provided, but such may be similar to the views of FIGS. 7A and 8A.

The footprint of die 10b of FIG. 9 comprises the area of the array 102, together with the areas of the row decoder circuitry 107, the bonding pad 20 and a portion of column decoder circuitry 108. In contrast, the footprint of the prior art die 400 of FIG. 5 comprises the area of the array together with areas of the bonding pad, both of the row and column decoders, and the periphery 118. Accordingly, the configuration of the die 10b of FIG. 9 may advantageously enable a larger number of dice to be formed from a single wafer than can be accomplished utilizing the prior art die 400 of FIG. 5. Further, the die 10b of FIG. 9 does not have a tiled architecture, which can simplify processing and reduce expense of fabrication of the die 10b of FIG. 9 relative to the prior art die of FIG. 6.

Figure 10:
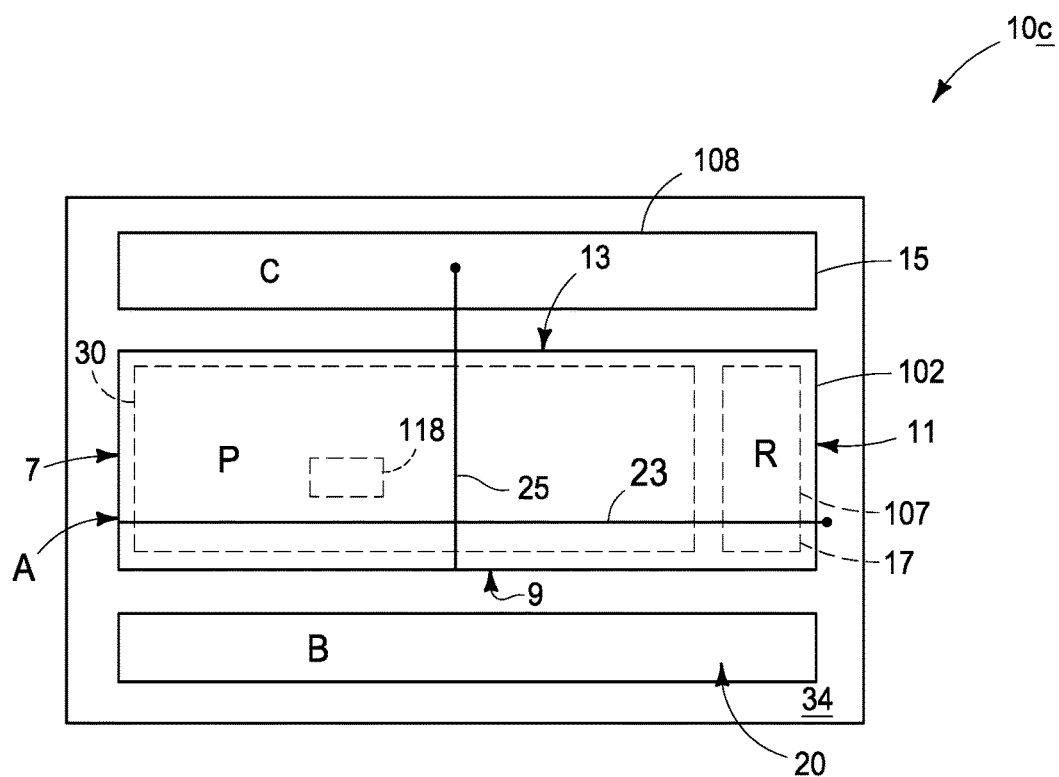

FIG. 10 shows a die 10c illustrating an example configuration in which column decoder circuitry 108 is within a unit 15 laterally adjacent to the array 102 of memory cells, and in which the row decoder circuitry 107 is within a unit 17 under the array of memory cells. The wordline 23 of FIG. 10 now extends beyond the decoder circuitry 107 so that lateral contact may be made between the decoder circuitry and the array. In other embodiments, other methods may be utilized to achieve electrical connection between the array and the decoder circuitry 107 underneath the array.

In the illustrated embodiment of FIG. 10, the bonding pad 20 is along the first primary side 9 of the rectangular array 102 and the unit 15 of column decoder circuitry 108 is along another of the primary sides (specifically side 13) which is in opposing relation to the first primary side.

A memory control unit 118 is specifically illustrated to be part of the peripheral circuitry 30 that is under the array 102 of FIG. 10. In other embodiments, the peripheral circuitry 30 may comprise other components in addition to, or alternatively to, the shown component 118.

The footprint of die 10c of FIG. 10 comprises the area of the array 102, together with the areas of the column decoder circuitry 108 and the bonding pad 20. In contrast, the footprint of the prior art die 400 of FIG. 5 comprises the area of the array together with areas of the bonding pad, both of the row and column decoders, and the periphery 118. Accordingly, the configuration of the die 10c of FIG. 10 may advantageously enable a larger number of dice to be formed from a single wafer than can be accomplished utilizing the prior art die 400 of FIG. 5. Further, the die 10c of FIG. 10 does not have a tiled architecture, which can simplify processing and reduce expense of fabrication of the die 10c of FIG. 10 relative to the prior art die of FIG. 6.

A cross-sectional side view of FIG. 10 is not provided, but such may be similar to the views of FIGS. 7A and 8A.

Figure 11:
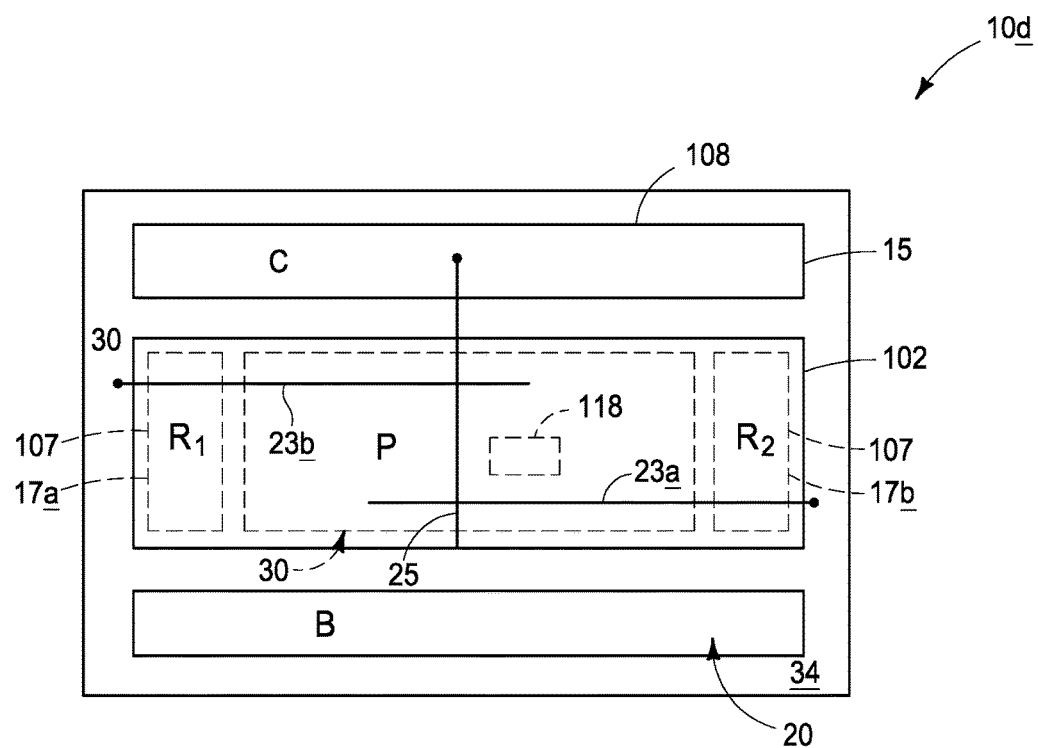

Referring to FIG. 11, a die 10d illustrates an example configuration in which the row decoder circuitry 107 is divided amongst two units 17a (also labeled $R_1$) and 17b (also labeled $R_2$) that are on opposing sides of the array 102 relative to one another. The utilization of two units of decoder circuitry may enable shorter wordlines 23a and 23b to be utilized relative to the embodiment of FIG. 10. This may enable desired performance characteristics to be achieved with higher resistance wordline materials as compared to the wordline materials suitable for utilization in the embodiment of FIG. 10.

A memory control unit 118 is specifically illustrated to be part of the peripheral circuitry 30 that is under the array 102 of FIG. 11. In other embodiments, the peripheral circuitry 30 may comprise other components in addition to, or alternatively to, the shown component 118.

The footprint of die 10d of FIG. 11 comprises the area of the array 102, together with the areas of the column decoder circuitry 108 and the bonding pad 20. In contrast, the footprint of the prior art die 400 of FIG. 5 comprises the area of the array together with areas of the bonding pad, both of the row and column decoders, and the periphery 118. Accordingly, the configuration of the die 10d of FIG. 11 may advantageously enable a larger number of dice to be formed from a single wafer than can be accomplished utilizing the prior art die 400 of FIG. 5. Further, the die 10d of FIG. 11 does not have a tiled architecture, which can simplify processing and reduce expense of fabrication of the die 10*d* of FIG. 11 relative to the prior art die of FIG. 6.

A cross-sectional side view of FIG. 11 is not provided, but such may be similar to the views of FIGS. 7A and 8A.

The row decoder circuitry 107 is subdivided amongst two units in the embodiment of FIG. 11. In other embodiments (not shown), the column detector circuitry 108 may be analogously subdivided. Also, although subdivision into two units is illustrated, in other embodiments the subdivision may be into more than two units.

The embodiment of FIG. 10 shows the row decoder unit 17 under the array 102 to be adjacent to one of the edges of the array. Such requires fabrication of wordlines 23 which extend a full dimension of the array. Depending on the size of the array and the resistance of the material utilized for the wordlines, there may be difficulties in configuring the wordlines while also maintaining low enough resistance to enable desired performance characteristics. FIG. 12 shows a die 10*e* illustrating an alternative arrangement in which the row decoder 17 under the array is provided as a single unit centrally located relative to the array. The array is subdivided into two units $A_1$ and $A_2$. In the shown embodiment, both units are approximately the same size as one another, which may be preferred in some applications in that it provides similar access times across the entirety of the array. However, in other embodiments one of the units $A_1$ and $A_2$ may be of a different size relative to the other. The units $A_1$ and $A_2$ may be considered to be portions of a single array in some embodiments, and in other embodiments may be considered to correspond to two different arrays of memory cells.

The row decoder circuitry 107 is configured as a single unit 17 having outer edges 41 that are directly under the array 102 of memory cells (with the outer edges being shown in phantom view to indicate that they are beneath array 102), and having a central region 43 which is not directly under the array.

The centralized location of row decoder circuitry 107 under the array 102 enables the long wordline 23 (FIG. 10) to be replaced with shorter wordlines 23*a* and 23*b*. This may enable desired performance characteristics to be achieved with higher resistance wordline materials as compared to the wordline materials suitable for utilization in the embodiment of FIG. 10.

In the shown embodiment, the periphery is subdivided into two units $P_1$ and $P_2$. Both periphery units are shown to approximately the same size as one another, which may be preferred in some applications. However, in other embodiments one of the units $P_1$ and $P_2$ may be of a different size relative to the other. The units $P_1$ and $P_2$ may be connected to one another through wiring provided in an interconnect region 45.

Figure 12:
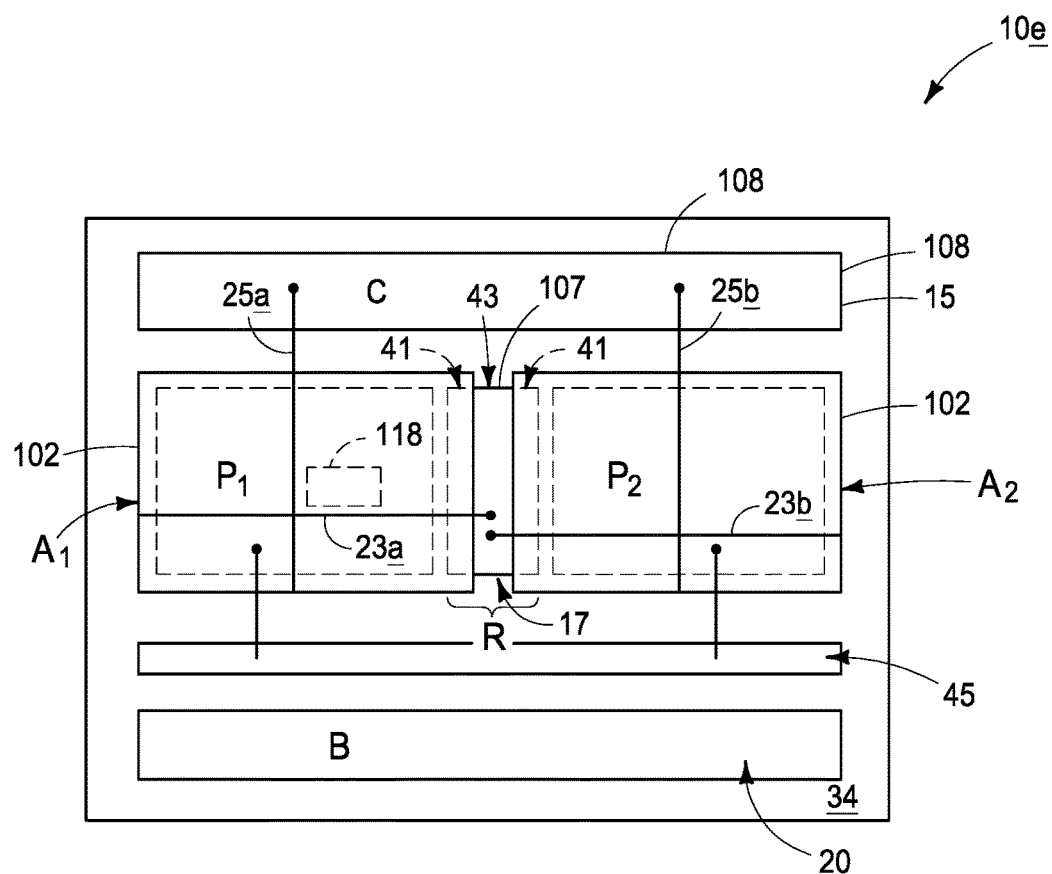

Bitlines 25*a* and 25*b* are shown in FIG. 12 to extend across array 102 from column decoder circuitry 108.

A memory control unit 118 is specifically illustrated to be part of the peripheral circuitry 30 that is under the array 102 of FIG. 12. In other embodiments, the peripheral circuitry 30 may comprise other components in addition to, or alternatively to, the shown component 118.

The footprint of die 10*e* of FIG. 12 comprises the area of the array 102, together with the areas of the column decoder circuitry 108, the bonding pad 20, and a portion of row decoder circuitry 107. In contrast, the footprint of the prior art die 400 of FIG. 5 comprises the area of the array together with areas of the bonding pad, both of the row and column decoders, and the periphery 118. Accordingly, the configuration of the die 10*d* of FIG. 11 may advantageously enable a larger number of dice to be formed from a single wafer than can be accomplished utilizing the prior art die 400 of FIG. 5. Further, the die 10*e* of FIG. 12 does not have a tiled architecture, which can simplify processing and reduce expense of fabrication of the die 10*e* of FIG. 12 relative to the prior art die of FIG. 6.

Figure 6:
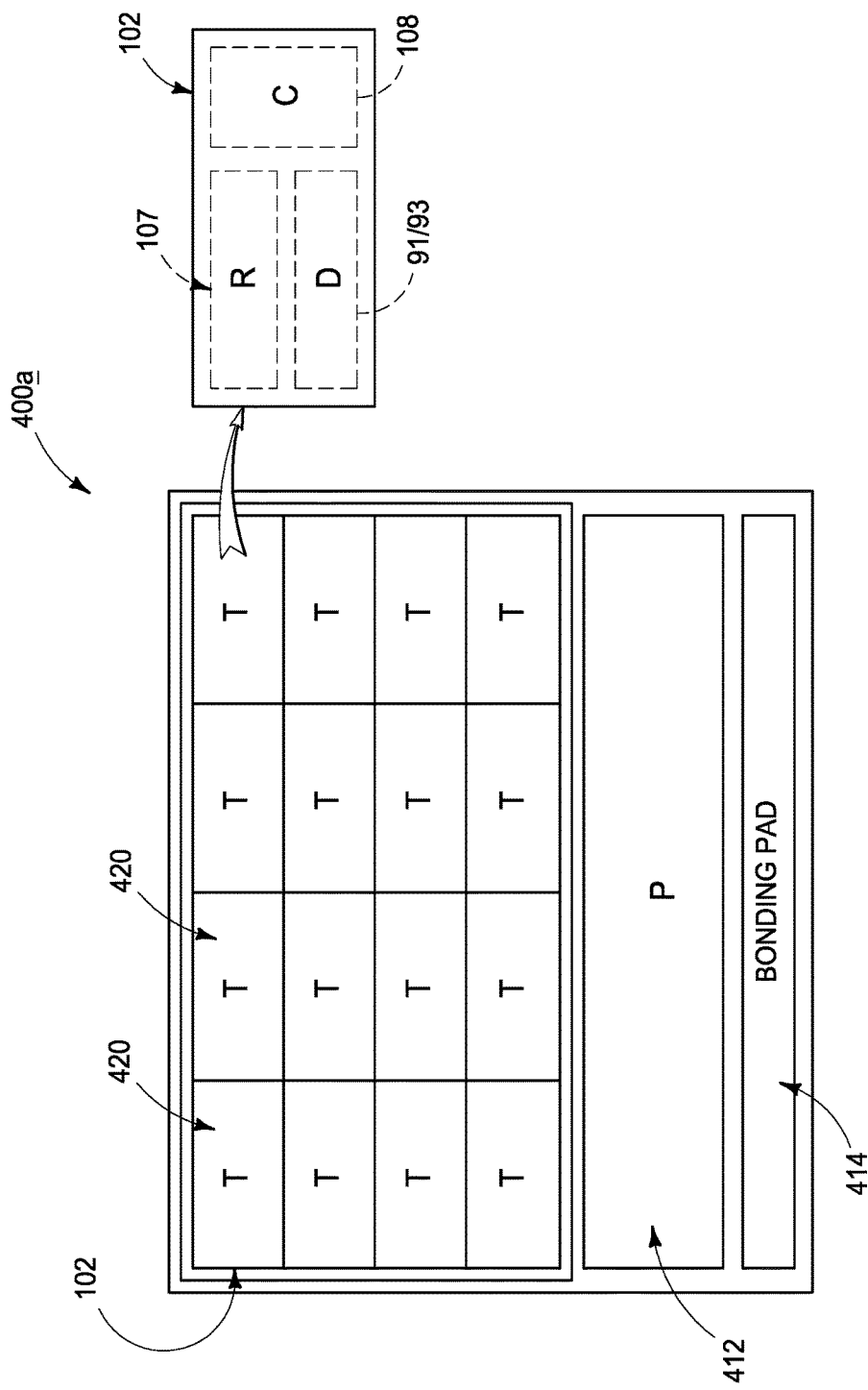

Although the specific embodiments of FIGS. 7-12 pertain to non-tiled architectures, in other embodiments some aspects may be incorporated into tiled architectures analogous to the architecture of FIG. 6. For instance, in some embodiments tiled architectures may be formed to have one of the row and column detectors at least partially under a memory array and the other laterally adjacent to the memory array.

The architectures described herein may be used in chips that are incorporated into in any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a device comprising an array of memory cells, a memory control unit at least partially under the array, row decoder circuitry in data communication with the memory control unit, and column decoder circuitry in data communication with the memory control unit.

Some embodiments include a device comprising an array of memory cells, $D_1$ decoder circuitry and $D_2$ decoder circuitry. One of the $D_1$ and $D_2$ decoder circuitries is in a first unit corresponding to row decoder circuitry and the other is in a second unit corresponding to column decoder circuitry. One of the first and second units is at least partially under the array of memory cells and the other of the first and second units is laterally outward of the array of memory cells.

Some embodiments include a device comprising an array of memory cells, column decoder circuitry at least partially under the array of memory cells, row decoder circuitry laterally outward of the array of memory cells, a memory control unit at least partially under the array of memory cells, and a bonding pad region laterally outward of the array of memory cells.

Some embodiments include a device comprising an array of memory cells, row decoder circuitry at least partially under the array of memory cells, column decoder circuitry laterally outward of the array of memory cells, a memory control unit at least partially under the array of memory cells, and a bonding pad region laterally outward of the array of memory cells.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A device, comprising:
    an array of memory cells disposed within a first level above a base, the array of memory cells being divided into a first array unit and a second array unit;
    row decoder circuitry disposed within a second level above the base, the second level being elevationally below the first level, the row decoder circuitry consisting of a single unit and being disposed partially under the first array unit and partially under the second array unit; and
    column decoder circuitry disposed within the first level laterally outward of the array of memory cells.

2. The device of claim 1 wherein the first array unit and the second array unit are of equivalent size.

3. The device of claim 1, further comprising peripheral circuitry disposed at the second level and comprising a memory control unit entirely under the array of memory cells.

4. The device of claim 3 wherein the peripheral circuitry comprises a first peripheral circuitry unit disposed entirely under the first array unit and a second peripheral circuitry unit disposed entirely under the second array unit.

5. The device of claim 4 wherein the first peripheral circuitry unit and the second peripheral circuitry unit are of equivalent size.

6. The device of claim 1 further comprising a bonding pad region disposed at the first level laterally outward of the array of memory cells.

7. The device of claim 1 wherein the bonding pad region is on an opposing side of the array of memory cells from the column decoder circuitry.

8. A device, comprising:
    a semiconductor die having a first level and a second level elevationally above the first level, the die comprising:
        an array of memory cells within the second level, the array being divided into a first array unit and a second array unit;
        column decoder circuitry within the second level laterally outward of the array of memory cells;
        peripheral circuitry divided into a first unit and a second unit, each of the first and second units being within the first level and being entirely under the array of memory cells;
        row decoder circuitry disposed within the first level between the first and second units of peripheral circuitry, and being disposed at least partially under the array of memory cells; and
        a bonding pad region laterally outward of the array of memory cells.

9. The device of claim 8 wherein the row decoder circuitry is partially under the first array unit and partially under the second array unit.

10. The device of claim 9 wherein the first array unit is spaced from the second array unit by a gap and wherein a central portion of the row decoder circuitry is disposed under the gap.

11. The device of claim 8 wherein the peripheral circuitry comprises a single memory control unit.

12. The device of claim 8 further comprising an interconnect region disposed laterally outward of the peripheral circuitry, the interconnect region providing connection between the first and second units of peripheral circuitry.

13. A device, comprising:
    a semiconductor die having a first level and a second level elevationally above the first level;
    an array of memory cells within the second level, the array of memory cells being divided into a first array unit and a second array unit, the first and second array units being separated by a gap;
    decoder circuitry comprising row decoder circuitry consisting of a single unit entirely within the first level, and column decoder circuitry consisting of a single unit entirely disposed within the second level on a first side of the array of memory cells;
    a bonding pad disposed along a second side of the array of memory cells, the second side opposing the first side; and
    a memory control unit within the first level and disposed entirely under the first array unit.

14. The device of claim 13 wherein the row decoder unit is centrally disposed relative to the array of memory cells.

15. The device of claim 13 wherein the row decoder unit is disposed partially under the first array unit and partially under the second array unit.

16. The device of claim 13 further comprising a first bitline extending across the first array unit from the column decoder circuitry and a second bitline extending across the second array unit from the column decoder circuitry.

17. The device of claim 13 wherein the memory control unit is within a first unit of peripheral circuitry disposed under the first array unit.

18. The device of claim 17 further comprising a second unit of peripheral circuitry disposed under the second array unit.

19. The device of claim 18 wherein the first and second peripheral units are of equivalent size.

20. The device of claim 13 wherein the first array unit and the second array unit are of equivalent size.

* * * * *